United States Patent
Lutschounig et al.

(10) Patent No.: US 6,284,983 B1
(45) Date of Patent: *Sep. 4, 2001

(54) MULTIFUNCTIONAL PRINTED CIRCUIT BOARD WITH AN OPTO-ELECTRONICALLY ACTIVE COMPONENT

(75) Inventors: Ferdinand Lutschounig, Klagenfurt; Andreas Starzacher, Leibsdorf, both of (AT)

(73) Assignee: AIK Electronics Austria GmbH, Klagenfurt (AT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/060,090

(22) Filed: Apr. 14, 1998

(30) Foreign Application Priority Data

Apr. 16, 1997 (DE) .................................. 197 15 658

(51) Int. Cl.$^7$ ........................................ H05K 1/16

(52) U.S. Cl. .................. 174/260; 313/494; 313/521; 428/690

(58) Field of Search ........................ 313/506, 508, 313/509, 494, 521; 428/690; 174/260

(56) References Cited

U.S. PATENT DOCUMENTS 3,634,714 * 1/1972 Anderson et al. .................. 313/494
5,652,067 * 7/1997 Ito et al. .......................... 313/506 X

FOREIGN PATENT DOCUMENTS

4319441A1  12/1994  (DE) .
4430907A1   6/1995  (DE) .
0758836A2   2/1997  (EP) .

* cited by examiner

Primary Examiner—Albert W. Paladini
(74) Attorney, Agent, or Firm—Thomas R. Vigil

(57) ABSTRACT

The invention relates to a multifunctional printed circuit board which is embodied so as to be a p.c.b. coated on at least one layer or one side with an electroconductive film, which printed circuit board is provided with one or more opto-electronically active components of the same or different wavelengths. In accordance with the invention, the optically active component is embodied so as to be a luminous field integrated in the printed circuit board, which field, during the manufacturing process of the printed circuit board, is screen-printed directly onto or above a suitably structured, electroconductive layer of the printed circuit board. By virtue thereof, in the course of the manufacture of the printed circuit board, it can be directly provided with suitable optical components, which will cooperate with the discrete components to be provided afterwards. Of course, the printed circuit boards provided with the optical components in accordance with the invention can be soldered using customary solder processes.

8 Claims, 5 Drawing Sheets

MULTIFUNCTIONAL PRINTED CIRCUIT BOARD WITH AN OPTO-ELECTRONICALLY ACTIVE COMPONENT

BACKGROUND OF THE INVENTION

The invention relates to a printed circuit board comprising one or more opto-electronically active luminous elements on the basis of electroluminescent systems, which elements can be made to emit light by applying a suitable supply voltage, thus converting passive printed circuit boards for interconnecting components into active multifunctional printed circuit boards, and the invention also relates to the application and method of manufacturing such a printed circuit board.

Thus, the invention relates to printed circuit boards with electroluminescent luminous fields, which are made to emit light upon application of a suitable voltage and frequency.

To manufacture electroluminescent arrangements by means of known printing techniques, electroluminescent coloring substances are known which are generally prepared on the basis of inorganic substances, such as, in particular, highly pure ZnS, CdS, $Zn_xCd_{1-x}S$, etc., compounds of the II and VI groups of the periodic system, which are customarily doped or activated with Cu, Mn, Ag, etc. Customary colors include yellow, green, greenish blue, bluish green and white. In accordance with the state of the art, such electroluminescent pigments, whose diameters range typically from 15 $\mu$m to 60 $\mu$m, are admixed in micro-encapsulated or non-encapsulated form with the various printing dyes, while taking into account the specific hygroscopic properties of the ZnS pigments. The binding agents used adhere well to so-called conductive ITO films (Indium-Tin-Oxide films), they are good insulators, they enhance the dielectric properties and hence improve the dielectric strength at high electric field intensities. The binding agents should additionally exhibit a good water-vapor resistance in the cured state, protect the phosphor pigments and extend the service life.

Customarily, such electroluminescent dyes, which are commonly also referred to as phosphor pastes, are applied to transparent synthetic-resin foils or glasses by means of screen printing or other coating methods such as spread coating, roller coating, etc. The synthetic-resin foils, etc., comprise a substantially transparent electroconductive coating serving as the electrode for the viewing side. Subsequently, the dielectric and the rear-side electrode are manufactured by means of printing and/or lamination techniques. Such an electroluminescent arrangement is known, for example, from DE-A-44 30 907.

Often the order of the manufacturing process is reversed, as described, for example, in DE-A-43 19 441, in which first the rear-side electrode is manufactured or use is made of a rear-side electrode in the form of a metallized foil on which the dielectric is applied or is already present thereon in the form of a coating. Subsequently, the phosphor paste and the transparent, electroconductive upper electrode is provided, for example, in the form of an ITO paste. Customarily, such a system is further covered with a transparent covering foil, thus protecting it against water vapor and mechanical damage.

Customary ITO-paste coatings (or also coatings of tin oxide, etc.) which are provided by screen printing have the advantage that they can be provided in almost any desired shape, however, they have the disadvantage, compared to vapor-deposited or sputtered transparent and electroconductive films, that their optical transparency is smaller and their surface conductivity of generally several 100 Ohm per square ($\Omega/\blacksquare$) is substantially smaller compared to several 10 Ohm per square in the case of ITO-polyester foils and a few Ohm per square in the case of ITO-coated glasses, whereby in the case of glasses, additionally, pastes can be used, for example $In_2O_3/SnO_2$, which must be fired at temperatures above 500° C., leading to an optical transparency beyond 95% at a film thickness of only 0.25 $\mu$m, and a conductivity in the case of a single coating of 500 to 1000 Ohm per square.

SUMMARY OF THE INVENTION

It is an object of the invention to manufacture, in a cost-effective manner, a multifunctional printed circuit board comprising integrated opto-electronic components, which demonstrates a long service life, a high luminous power and functionality at the available current-supply conditions, and integration in available PCB-manufacturing processes should be possible.

This object is achieved by an arrangement as described in the characterizing part of claim 1, and by a method of manufacturing this arrangement as described in the characterizing part of claim 6.

In the present case, use is made of methods and processes from the printed circuit board industry, in particular the screen-printing technique for manufacturing so-called single-sided, double-sided and multilayer printed circuit boards. The customarily used materials for the printed circuit boards, i.e. so called copper-clad laminates of the types XPC, FR-1, FR-2, FR-3, FR-4, CEM-1 to -3, polyimide foils as well as fleeces and bendable and flexible foils constitute the base substrate.

The base electrode for the luminous field as well as the connecting electrode for the transparent upper-side electrode (cover electrode) are generally formed by structuring of the typically 17, 35 or 70 $\mu$m thick copper foil. The copper foil can be provided with any desired structure by means of customary etching processes. To manufacture the dielectric use can be made of suitably insulating and, in general, properly reflecting screen-printing dyes, however, in particular of so-called solder-stop lacquers which, in the manufacture of the printed circuit board, are provided anyway to protect the fully etched conductor paths. In this connection, it has been found that 1-component UV-curing lacquers as well as 2-component thermo-curing lacquers can very suitably be used for more exacting applications.

To obtain a high dielectric strength, use is customarily made of two printing processes in which different sieves are employed, consequently, it is alternatively possible to employ combinations of semi-transparent and pigmented (for example white) or properly reflecting screen-printing dyes/solder-stop lacquers. The dielectric strength of such lacquers is approximately above 30 volt per micrometer of film thickness (typically 100 V/$\mu$m), so that in the case of customary film thicknesses in the range from 15 to 25 $\mu$m in the cured state, a sufficient dielectric strength would already be obtained by using one insulating film. However, for process, function and service life-related reasons, in general, two films are provided.

In a special embodiment, use may alternatively be made of photosensitive or photostructurable solder-stop lacquers which are applied by means of screen printing or curtain coating to obtain a high-quality, continuous, thin dielectric film having the highest possible dielectric strength.

Customarily, the electroluminescent dyes (phosphor pastes) are provided by screen printing and the desired geometries and colors can be set graphically. To achieve special color effects, use can be made, on the one hand, of pigmented, translucent and graphically formed masks and, on the other hand, of specially prepared pastes admixed with, for example, daylight luminous dyes or alternatively further luminescent pigments to achieve an appropriate emission spectrum. Optionally, these pigments can also be introduced into the transparent protective film.

The manufacture of the upper-side electrode (cover electrode) also typically takes place by means of screen printing on the phosphor paste. Customarily, use is made of so-called ITO pastes, which can be thermally cured already at relatively low temperatures, for example, of 120° C. and yield an optical transparency in the range from 70 to 85%. In the case of relatively small surface areas or small longitudinal dimensions, the electrical connection can only be made on one side on a copper connecting electrode from which, of course, the oxide film should be removed. If the luminous fields are more complex or comprise a larger surface area, customarily a so-called busbar connection will be used. In this case, the connecting electrode in the form of the copper foil will be brought into contact with the ITO film along the outline of the luminous field, resulting in a uniform electrical field distribution throughout the luminous field.

In accordance with an alternative embodiment, the cover electrode is not formed by a transparent ITO film but by a structured, electroconductive surface composed of conductive pastes, synthetic-resin coated copper foil provided by means of a squeegee, etc. The electric field which forms between this cover electrode and the base electrode causes the intermediate luminescent film to emit light. The generated light can emanate from the exposed regions in the structured cover electrode, the cover electrode being constructed so as to be, for example, a fine grating. Optionally, the luminescent film may be printed onto the structured cover electrode, in which case the phosphor particles present in the exposed regions of the structured cover electrode are made to emit light.

After the manufacture of the electroconductive and substantially transparent upper-side electrode, a graphical design operation may follow. In said operation, translucent and opaque dyes, or a film provided with phosphorescent or fluorescent dyes, are provided by means of printing in accordance with the desired graphical design. Subsequently, in the last step in the manufacture of a multifunctional printed circuit board, a protective transparent solder-stop mask can be provided again in which copper-connecting points are left uncovered.

An important advantage of the invention resides in that the optical luminous fields can be integrated into the printed circuit board prior to the component-insertion and soldering operations. On the printed circuit boards provided with luminous fields, components can be inserted and soldered in the conventional manner without causing damage to the luminous fields. Said luminous fields can be integrated in a simple manner in the PCB wiring and/or the components inserted on the PCB.

In this manner, a low-cost alternative is created for all types of display elements, such as a remote control, the illumination of a light switch or of a front panel of a video recorder or a washing machine or the illumination of an escape-route indicator panel. In particular, existing printed circuit board systems can be supplemented with active luminous fields exhibiting an extremely uniform illumination, a good signalizing effect, absence of heating and an extremely low current consumption. In addition, they can be mains-operated, i.e. at 100 to 240 volts and 50 or 60 Hz, respectively, provided that the electroluminescent fields are embodied accordingly, and they can also be operated at a few volts lower DC voltage while using customary inverter components to bring about the transformation to the necessary AC voltage.

For such a product use can very suitably be made of screen printing pastes comprising phosphor pigments, particularly micro-encapsulated pigments, but also non-encapsulated pigments, on the basis of suitably doped compounds of the II and VI group of the periodic system, particularly in the form of Cu, Mn, Ag, etc. —doped ZnS pigments in combination with printed circuit board substrates. Admixtures of further luminous dyes, particularly those which due to electroluminescent radiation bring about light excitation and emission of the corresponding radiation with spectra eligible in wide ranges or narrow-band wavelength peaks, are very positive and effective. By virtue thereof, solder-bath resistant multifunctional systems can be manufactured, which has hitherto been impossible with the known polyester foil solutions.

In a further embodiment, the printed circuit board is masked and etched in a customary manner, and the desired luminous fields are provided on the printed circuit board in the form of a film structure which is provided afterwards by printing, coating or gluing. This has the advantage that the available space is optimally used, because the luminous fields, as well as the inserted components, can be arranged over the conductor paths so that they do not require a surface area all for themselves.

A further typical embodiment does not only comprise a luminous field arrangement having two electric connections, but also a plurality of fields, for example fields luminescing in different colors or having characters and/or symbols.

A variant application of such printed circuit boards having luminous fields, comprises the insertion in an injection moulding machine. In this method, transparent and colored thermoplastic synthetic resins are used to achieve the desired shapes. Interesting variants are, in particular, transparent and translucent colored polycarbonates (PC) and polymethyl methacrylate (PMMA) as well as colored thermoplastic synthetic resins. Optical lenses or optical waveguide systems are often formed to enhance the electroluminescentluminous effects.

BRIEF DESCRIPTION OF THE DRAWING

These and other aspects of the invention will be apparent from and elucidated with reference to the embodiments described hereinafter.

In the drawings.

DESCRIPTION OF THE PREFERRED EMBODIMENTS

Figure 1:
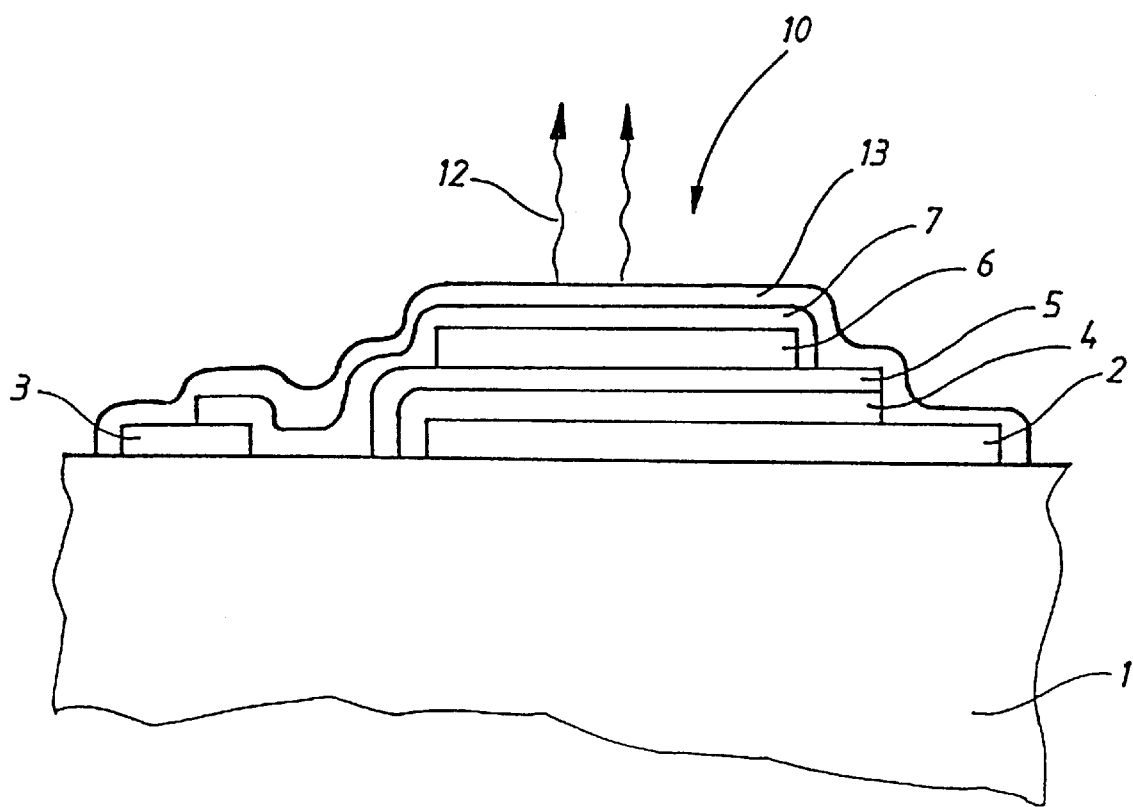
FIG. 1 is a cross-sectional view of an embodiment of an electroluminescent field on a printed circuit board.

In FIG. 1, a printed circuit substrate 1 is provided with structured copper conductor tracks 2 and 3, the conductor track 2 forming the base electrode of the electroluminescent surface 10, and the conductor track 3 forming the connection track for the cover electrode. The base electrode 2 is first provided with, preferably, two insulating or dielectric films 4 and 5 having a good reflecting effect. These insulating films 4, 5 are provided, in accordance with the desired shape of the electroluminescent field, with a film of an electroluminescent dye 6. Subsequently, the cover electrode in the form of an indium-tin-oxide film 7 (ITO film) is provided. Customarily, a protective film covering the entire surface is provided, which extends as far as the copper connecting surfaces; in the present case, use is preferably made of a transparent solder-stop lacquer, because it ensures solder-bath resistance and provides an additional shield against water vapor. Dependent upon the type of embodiment, various insulating or dielectric films may be added or omitted. The main direction of radiation of the luminous field is indicated by means of the arrows 12. The entire electroluminescent arrangement can be covered with a suitable (patterned) cover film 13.

Figure 2:
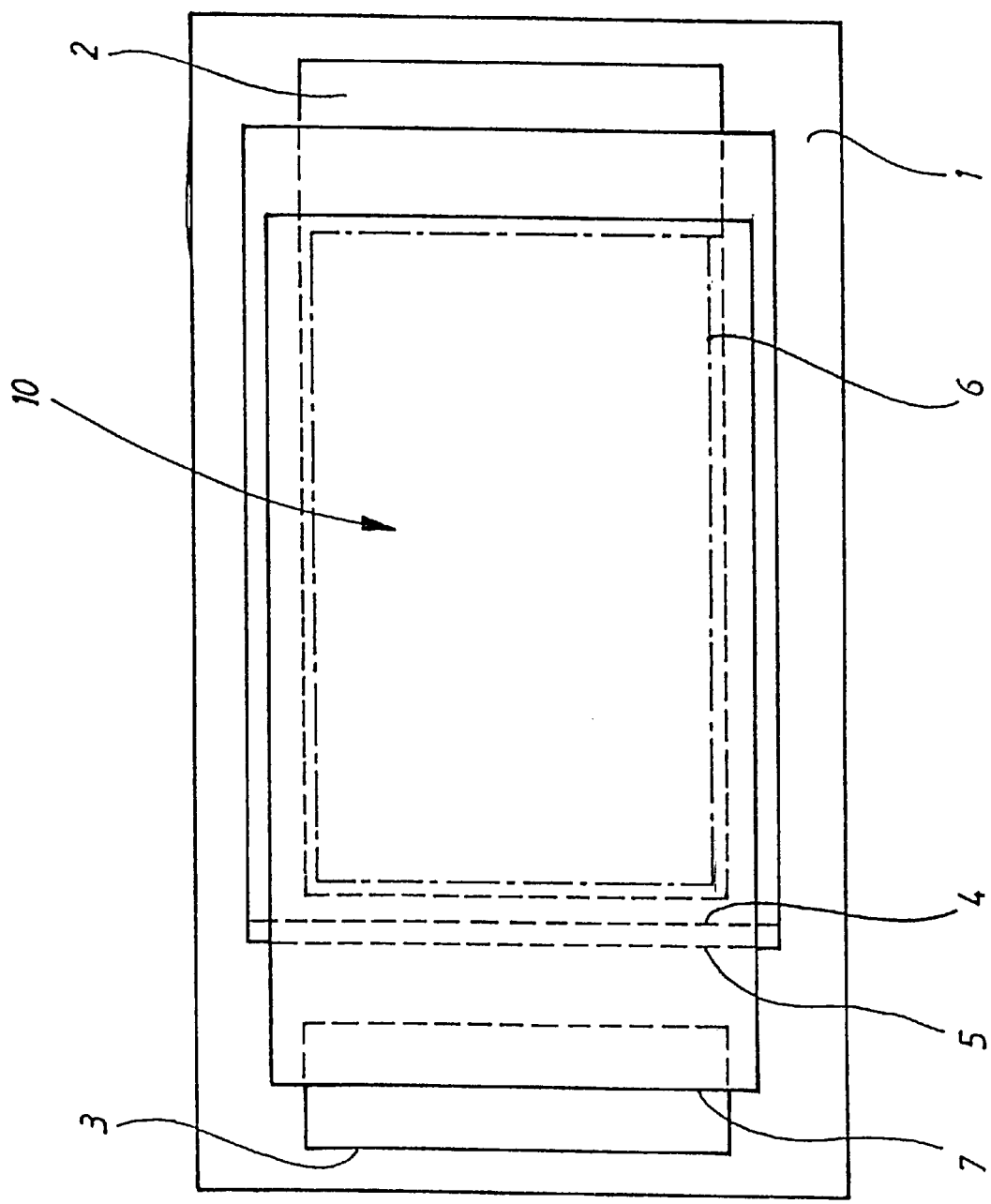
FIG. 2 is a plan view of a printed circuit board comprising an electroluminescent field in accordance with FIG. 1.

FIG. 2 is a plan view of a typical, single printed circuit board element 1 comprising a luminous field and copper connecting surfaces 2, 3 on both sides. The copper surface 2 forms the base electrode of the luminous field 10, which surface is first printed with one or two films 4, 5 of a dielectric material. One area of the copper surface 2 is left unprinted, as this is the site of contact with the copper electrode 2. Subsequently, the dielectric films 4, 5 are provided with a luminescent film 6. The cover electrode 7 consists, in this example, of an indium-tin-oxide film which covers the luminescent film and, for making contact, is connected to the copper electrode 3.

Figure 3:
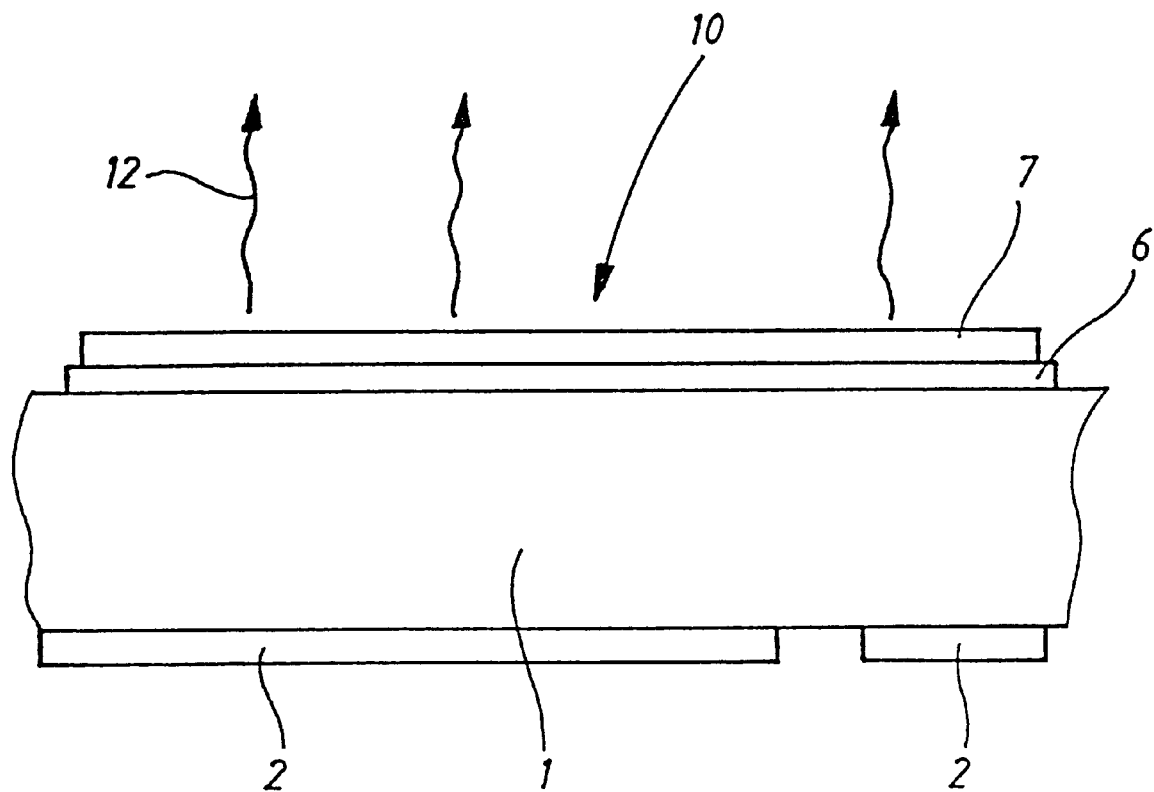
FIG. 3 is a cross-sectional view of an electroluminescent field on a printed circuit board, the supporting board (substrate) for the printed circuit board being used as the dielectric.

FIG. 3 is a cross-sectional view of an electroluminescent element, in which the PCB-supporting board 1 (substrate) serves as the dielectric. One electrode is formed by applying a coating, i.e. the copper track 2, on one side of the supporting board 1. Next, the luminescent film 6 is provided on the opposite surface of the supporting board 1. This luminescent film is covered by a further film forming the cover electrode and consisting, for example, of an ITO-film. The luminous radiation 12 escapes on the side of the printed circuit board on which the luminescent film 6 is applied.

Figure 4:
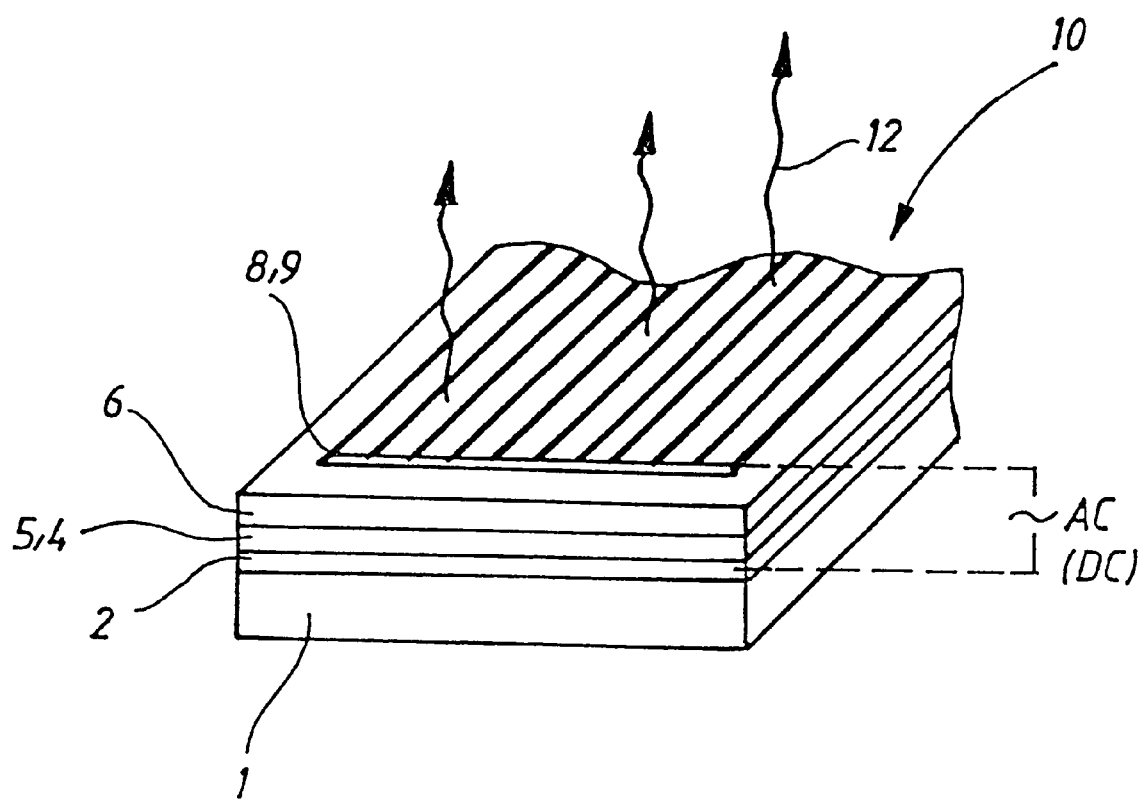
FIG. 4 is a perspective view of an electroluminescent field, the cover electrode being embodied so as to be an electroconductive surface (non-transparent) which can be structured in accordance with the requirements.

Unlike, for example, FIG. 1, the cover electrode shown in FIG. 4 is not formed by a transparent ITO-film but by a structured, electroconductive surface 8, 9 of conductive pastes, synthetic-resin coated copper foil provided by a squeegee, etc. The electric field which forms between this cover electrode 8, 9 and the base electrode 2 causes the intermediate luminescent film 6 to emit light. The light generated can emanate from the exposed regions in the structured cover electrode, said cover electrode being embodied, in this example, so as to be a fine grating. Optionally, the luminescent film 6 may also be printed onto the structured cover electrode 8, 9, in which case the phosphor particles present in the exposed regions of the structured cover electrode are excited so as to emit light. Optionally, further insulating films may be arranged between 6 and 8, 9.

Figure 5:
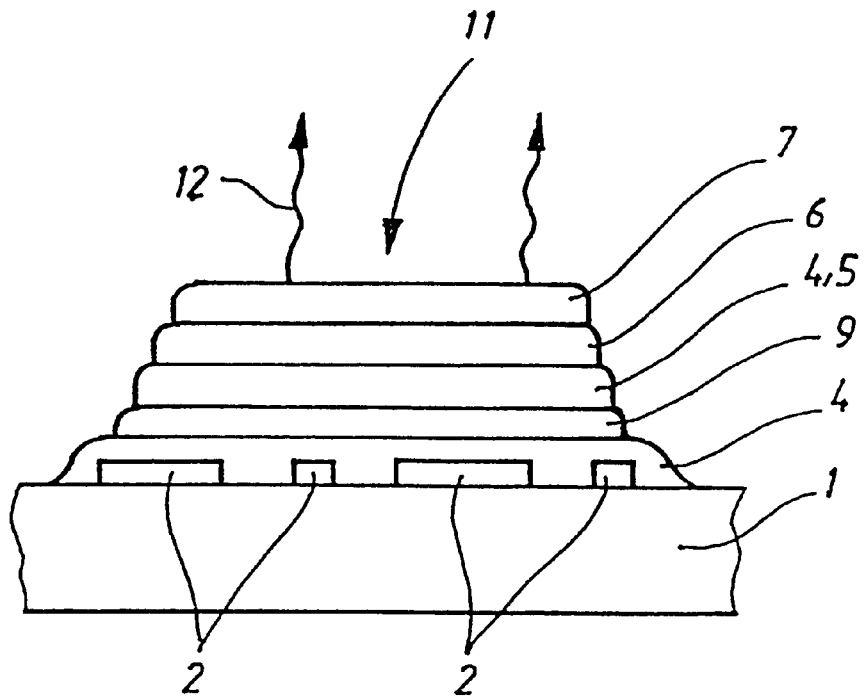
FIG. 5, is a cross-sectional view of an electroluminescent field, in which the luminous field superposed on an existing PCB layout (copper tracks)

FIG. 5 is a cross-sectional view of an electroluminescent element which is superposed on an existing PCB-layout 1 having copper tracks 2. This existing layout 1, 2 is provided with an insulating film 4 (composed of special solder-stop lacquer) and a base electrode 9, which is formed by printing using a conductive paste (silver, carbon, copper or the like). The further construction takes place as described with reference to FIG. 1.

Figure 6:
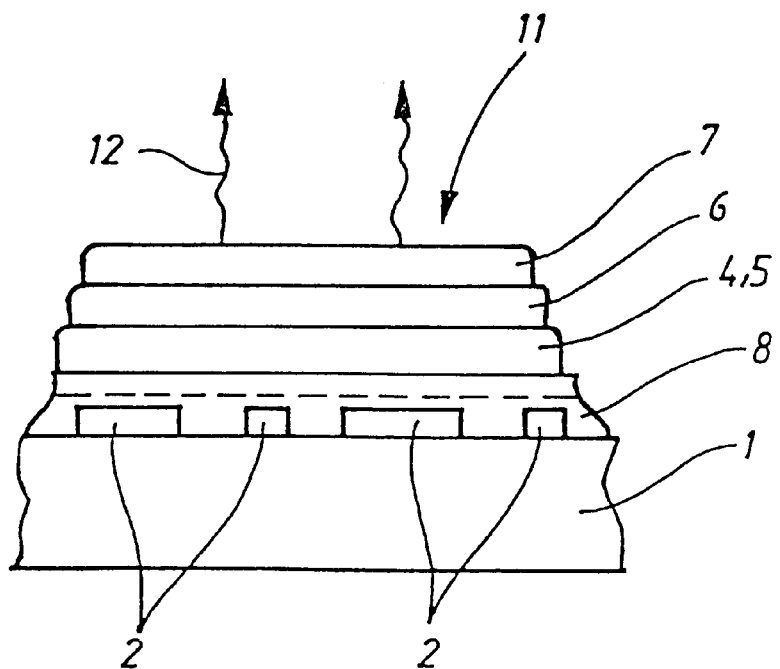
FIG. 6 is a cross-sectional view of an electroluminescent field, in which the luminous surface is superposed on an existing PCB layout (copper tracks).

In FIG. 6, a synthetic-resin coated copper foil 8 is squeegeed onto the existing PCB-layout 1, 2, which foil is suitably structured and forms the base electrode of the luminous field. The further construction of the luminous field takes place as described with respect to FIG. 1.

Explanation of the reference numerals used in the drawings 1 substrate of the printed circuit board
2 copper foil (base electrode)
3 copper foil (base electrode)
4 insulating film 1
5 insulating film 2
6 electroluminescent film (=E.L. luminous field)
7 cover electrode (ITO-film)
8 synthetic-resin coated copper foil (base or cover electrode)
9 conductive paste of copper, silver or carbon
10 luminous field
11 luminous field
12 radiation direction
13 (patterned) cover film

What is claimed is:

1. A multifunctional printed circuit board, comprising a PCB supporting board (1), which is coated, at least on one side with a first electroconductive film (2,3), said printed circuit board comprising one or more opto-electronically active components of the same or different wavelengths, which are embodied so as to take the form of a luminous field which is integrated in the printed circuit board, characterized in that:

the luminous field (10; 11) comprises at least one insulating film (4,5), a luminescent film (6), and a cover electrode (7; 8,9), the luminous field is screen printed directly onto a suitably structured, electroconductive film (2,3; 9;8) comprising a base electrode (2;9;8) in the course of the PCT-manufacturing process, said printed circuit board is constructed and arranged to radiate light outwardly from said luminous film (6) and away from said supporting board (1) of said printed circuit board, the cover electrode (7; 8,0) is arranged so as to cover substantially all of the electroluminescent film (6) and to directly contact copper connecting surfaces (3), which form part of the first electroconductive film (2,3), and the entire luminous field (10,11) is covered with a transparent insulating film or a solder-stop mask, thus protecting the entire luminous field from environmental influences and enabling customary solder processes to be employed.

2. A printed circuit board as claimed in claim 1, characterized in that the base electrode (2) is part of the first electroconductive film (2,3).

3. A printed circuit board as claimed in claim 1, characterized in that the copper connecting surfaces (3) for the base or cover electrode are directly integrated in a wiring of the printed circuit board.

4. A printed circuit board as claimed in claim 1, characterized in that the first electroconductive film comprises copper.

5. A printed circuit board as claimed in claim 1, characterized in that the insulating film is made of a material chosen from the group of suitably insulating and properly reflecting dyes or of solder-stop lacquers.

6. A printed circuit board as claimed in claim 5, characterized in that the insulating film is made of photosensitive or photostructurable solder-stop lacquers.

7. A printed circuit board as claimed in claim 1, characterized in that the cover electrode (8,9) is formed by a structured, electroconductive surface composed of conductive pastes and/or synthetic-resin coated copper foil provided by means of squeegee.

8. A printed circuit board as claimed in claim 7, characterized in that the luminescent film (6) is printed onto the structured cover electrode (8,9).

* * * * *